(12) United States Patent
Chou et al.

(10) Patent No.: US 11,929,281 B2
(45) Date of Patent: Mar. 12, 2024

(54) REDUCING OXIDATION BY ETCHING SACRIFICIAL AND PROTECTION LAYER SEPARATELY

(71) Applicant: Taiwan Semiconductor Manufacturing Co., Ltd., Hsinchu (TW)

(72) Inventors: Chia Cheng Chou, Keelung (TW); Chung-Chi Ko, Nantou (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 119 days.

(21) Appl. No.: 17/480,201

(22) Filed: Sep. 21, 2021

(65) Prior Publication Data

US 2022/0406647 A1   Dec. 22, 2022

Related U.S. Application Data

(60) Provisional application No. 63/211,772, filed on Jun. 17, 2021.

(51) Int. Cl.
*H01L 21/768*     (2006.01)
*H01L 23/532*     (2006.01)
*H01L 23/535*     (2006.01)

(52) U.S. Cl.
CPC .... *H01L 21/7682* (2013.01); *H01L 21/76805* (2013.01); *H01L 21/76846* (2013.01); *H01L 21/76849* (2013.01); *H01L 21/76895* (2013.01); *H01L 23/5329* (2013.01); *H01L 23/535* (2013.01)

(58) Field of Classification Search
CPC .......... H01L 21/7682; H01L 21/76805; H01L 21/76846; H01L 21/76849; H01L 21/76895; H01L 21/76816; H01L 21/76831; H01L 21/76843; H01L 21/76844; H01L 21/76807; H01L 21/76802; H01L 21/76877;
(Continued)

(56) References Cited

U.S. PATENT DOCUMENTS 9,514,980 B2   12/2016  Lee et al.
10,410,916 B2   9/2019  Hong et al.
(Continued)

FOREIGN PATENT DOCUMENTS

KR   20140123639 A   10/2014
KR   20190087843 A   7/2019
(Continued)

*Primary Examiner* — Shahed Ahmed
*Assistant Examiner* — Vicki B. Booker
(74) *Attorney, Agent, or Firm* — Slater Matsil, LLP

(57) ABSTRACT

A structure includes a first conductive feature, a first etch stop layer over the first conductive feature, a dielectric layer over the first etch stop layer, and a second conductive feature in the dielectric layer and the first etch stop layer. The second conductive feature is over and contacting the first conductive feature. An air spacer encircles the second conductive feature, and sidewalls of the second conductive feature are exposed to the air spacer. A protection ring further encircles the second conductive feature, and the protection ring fully separates the second conductive feature from the air spacer.

20 Claims, 22 Drawing Sheets

(58) Field of Classification Search
CPC .......... H01L 21/76804; H01L 21/7685; H01L 23/5329; H01L 23/535; H01L 2221/1042
See application file for complete search history.

(56) References Cited

U.S. PATENT DOCUMENTS

| | | |
|---|---|---|
| 10,943,824 B2 | 3/2021 | Lee et al. |
| 11,107,896 B2 | 8/2021 | Huang et al. |
| 2001/0016412 A1* | 8/2001 | Lee .................... H01L 23/5222 |
| | | 438/622 |
| 2013/0207267 A1* | 8/2013 | Rho .................... H01L 21/0217 |
| | | 257/E23.079 |
| 2015/0179582 A1 | 6/2015 | Baek et al. |
| 2017/0200636 A1* | 7/2017 | Shiu .................. H01L 21/76877 |
| 2018/0012791 A1* | 1/2018 | Sun .................... H01L 23/5222 |

FOREIGN PATENT DOCUMENTS

| | | |
|---|---|---|
| TW | 201813038 A | 4/2018 |
| TW | 202013600 A | 4/2020 |
| TW | 202021002 A | 6/2020 |
| TW | 202103260 A | 1/2021 |

\* cited by examiner

REDUCING OXIDATION BY ETCHING SACRIFICIAL AND PROTECTION LAYER SEPARATELY

PRIORITY CLAIM AND CROSS-REFERENCE

This application claims the benefit of the following provisionally filed U.S. Patent application: Application No. 63/211,772, filed on Jun. 17, 2021, and entitled "Novel N2 ELK Approach for Device Performance Improvement," which application is hereby incorporated herein by reference.

BACKGROUND

Integrated circuit devices such as transistors are formed on semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias in a low-k dielectric layer, the low-k dielectric layer is etched to form trenches and via openings. The etching of the low-k dielectric layer may involve forming a patterned hard mask over the low-k dielectric material, and using the patterned hard mask as an etching mask to form trenches. Via openings are also formed underlying the trenches. The trenches and the via openings are then filled with a metallic material, which may comprise copper. A Chemical Mechanical Polish (CMP) process is then performed to remove excess portions of the metallic material over the low-k dielectric layer.

Air spacers are known to have a low k value, which is equal to 1.0. In conventional processes for forming air spacers between metal lines, the dielectric material between two metal lines is removed first, followed by re-depositing another dielectric material between the two metal lines. The deposition process is controlled so that an air spacer is formed in the refilled dielectric material. A CMP process is then performed to remove excess portions of the filled dielectric material, which excess portions are over the metal lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
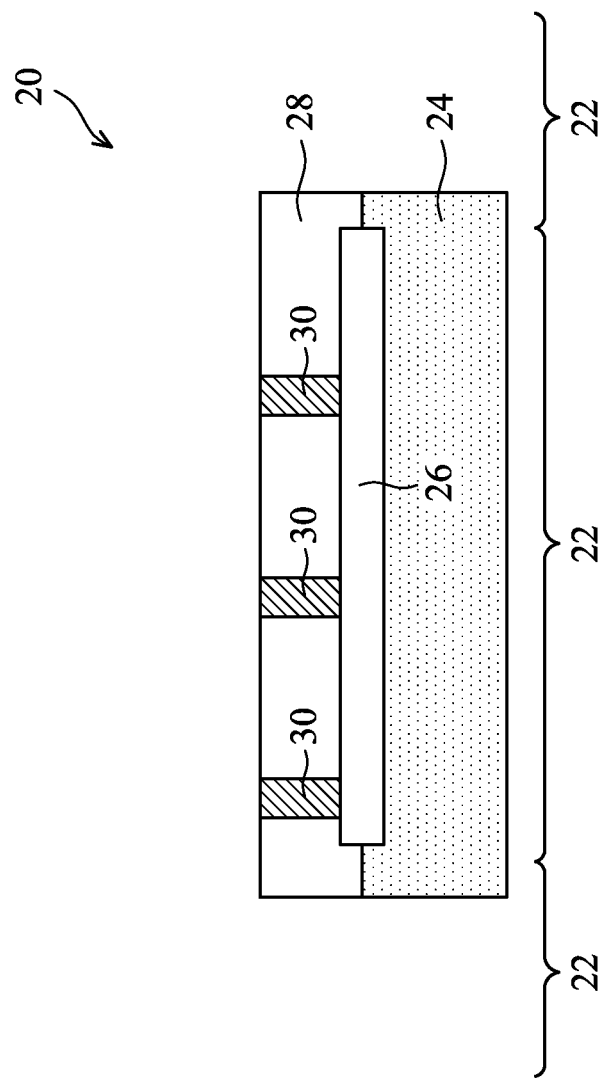
FIGS. 1-10, 11A, 11B, 12-16, and 17A illustrate the cross-sectional views of intermediate stages in the formation of conductive features and air spacers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An air spacer and the method of forming the same are provided. In accordance with some embodiments of the present disclosure, a sacrificial spacer is deposited, followed by a first anisotropic etching process to remove the horizontal portions of the sacrificial layer and to form a sacrificial ring. A protection layer is then deposited, followed by a second anisotropic etching process to remove the horizontal portions of the protection layer to form a protection ring encircled by the sacrificial ring. By performing the first etching process before the deposition of the protection layer, the protection ring may physically contact the underlying feature. Accordingly, after the sacrificial ring is removed, the protection ring prevents the bottom portion of a subsequently formed barrier layer from being oxidized and damaged by chemicals. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 19:
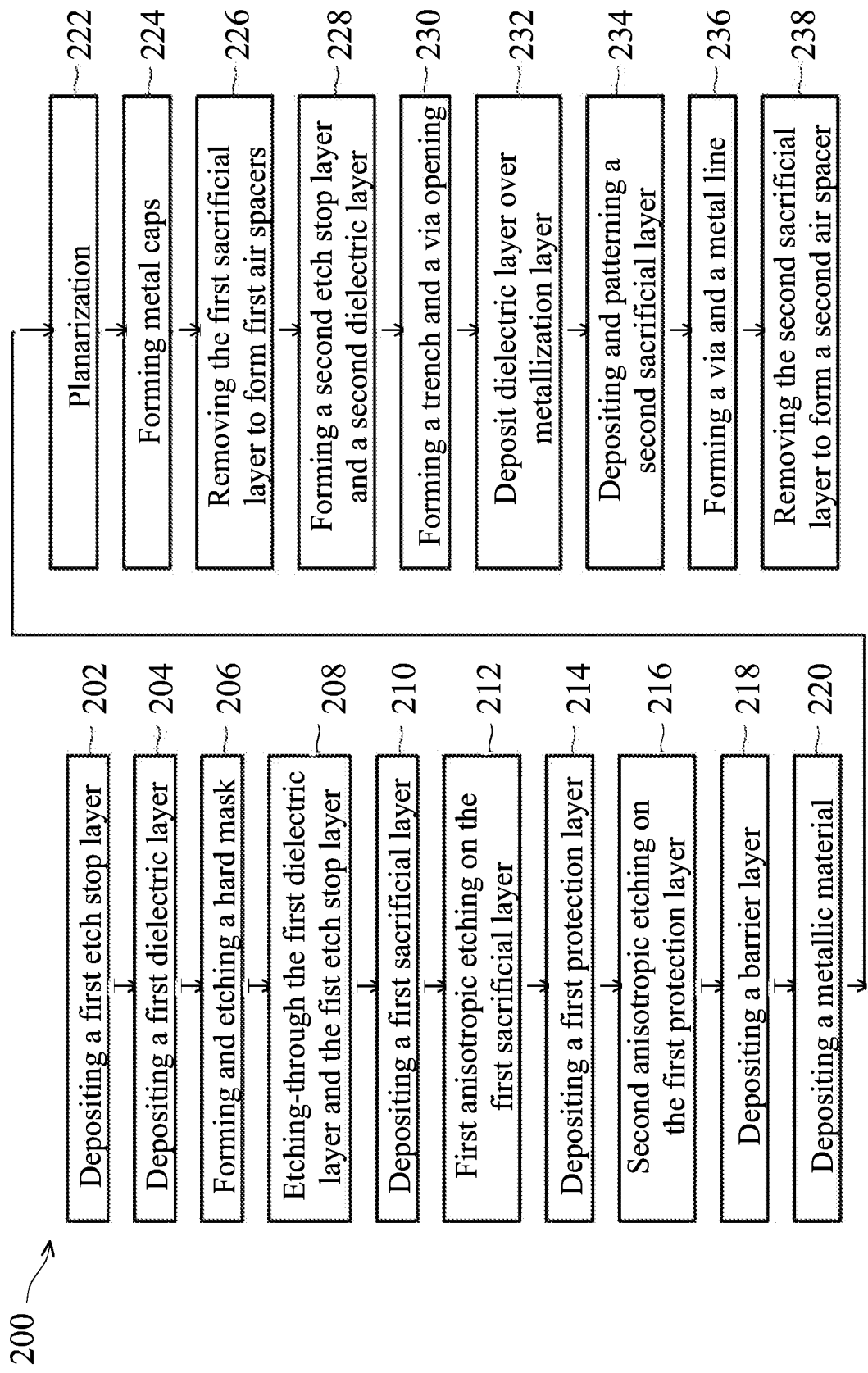
FIG. 19 illustrates a process flow for forming conductive features and air spacers in accordance with some embodiments.

FIGS. 1-10, 11A, 11B, 12-16, and 17A illustrate the cross-sectional views of intermediate stages in the formation of conductive features and air spacers in accordance with some embodiments of the present disclosure. The corresponding processes are also reflected schematically in the process flow 200 as shown in FIG. 19.

FIG. 1 illustrates a cross-sectional view of package component 20. In accordance with some embodiments of the present disclosure, package component 20 is a device wafer including active devices and possibly passive devices, which are represented by the illustrated integrated circuit devices 26. Device wafer 20 may include a plurality of dies 22 therein, with one of dies 22 illustrated. In accordance with alternative embodiments of the present disclosure, package component 20 is an interposer wafer, which may or may not include active devices and/or passive devices. In subsequent discussion, a device wafer is discussed as an example of package component 20. The embodiments of the present disclosure may also be applied to other types of package components such as interposer wafers, package substrates, packages, etc.

In accordance with some embodiments, wafer 20 includes semiconductor substrate 24 and the features formed at a top surface of semiconductor substrate 24. Semiconductor substrate 24 may be formed of crystalline silicon, crystalline germanium, silicon germanium, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may be (or may not be) formed to extend into semiconductor substrate 24, wherein the through-vias are used to electrically intercouple the features on opposite sides of semiconductor substrate 24. In accordance with alternative embodiments, wafer 20 is used for forming interposers, and substrate 24 may be a semiconductor substrate or a dielectric substrate.

Figure 18:
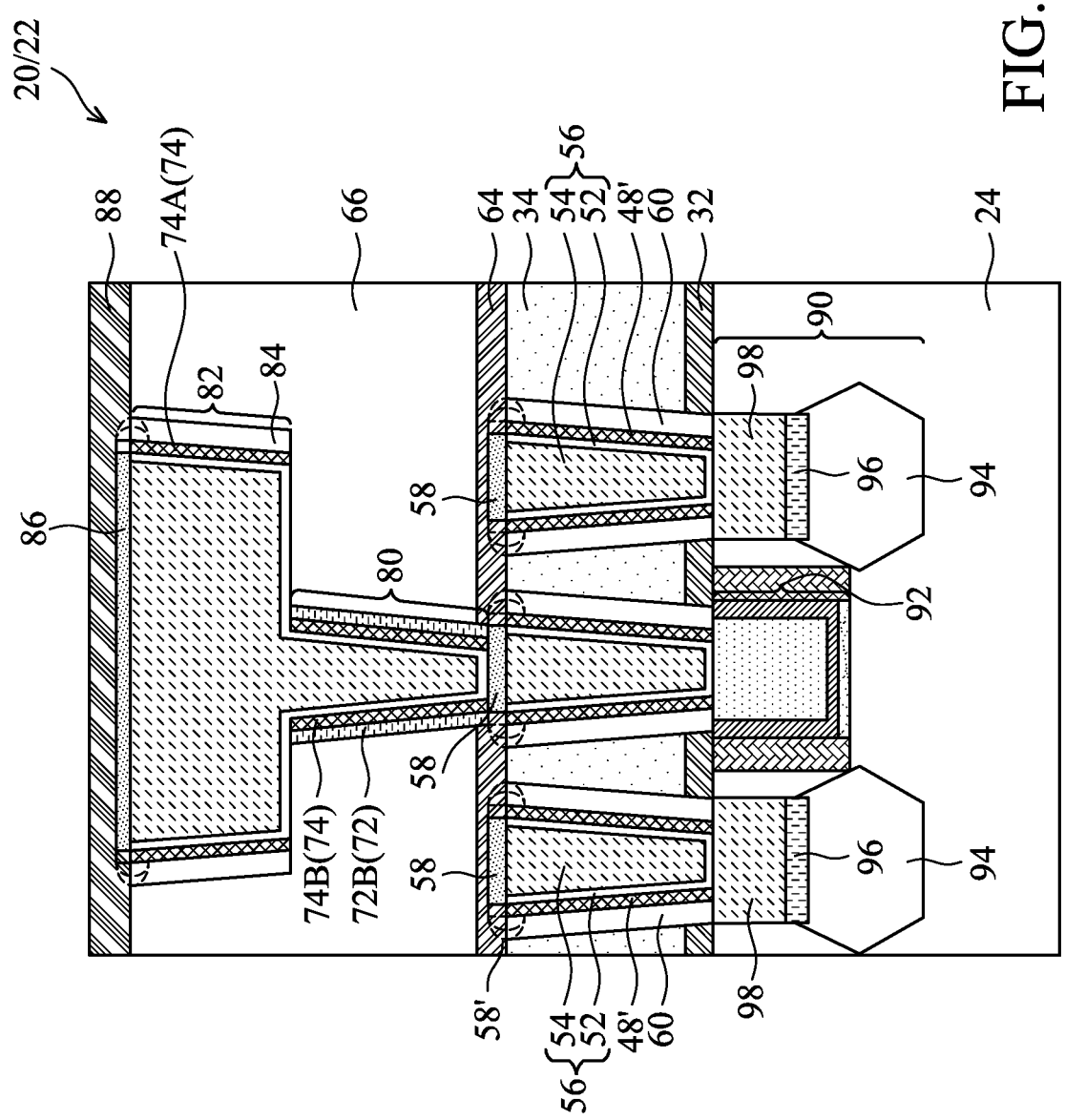
FIG. 18 illustrates the air spacers formed surrounding contact plugs in accordance with some embodiments.

In accordance with some embodiments of the present disclosure, integrated circuit devices 26 are formed at the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated in FIG. 1. FIG. 18 illustrates a schematic view of an example transistor in accordance with some embodiments, which includes gate stack 92 and source/drain regions 94, which are formed at the top surface of semiconductor substrate 24.

Referring back to FIG. 1, Inter-Layer Dielectric (ILD) 28 is formed over semiconductor substrate 24, and fills the space between the gate stacks of transistors (not shown) in integrated circuit devices 26. In accordance with some embodiments, ILD 28 is formed of or comprises Phospho Silicate Glass (PSG), Boro Silicate Glass (BSG), Boron-doped Phospho Silicate Glass (BPSG), Fluorine-doped Silicate Glass (FSG), silicon oxide, or the like. ILD 28 may be formed using spin coating, Flowable Chemical Vapor Deposition (FCVD), or the like. In accordance with some embodiments of the present disclosure, ILD 28 is formed using a deposition process such as Plasma Enhanced Chemical Vapor Deposition (PECVD), Chemical Vapor Deposition (CVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of a conductive material selected from tungsten, aluminum, copper, titanium, tantalum, titanium nitride, tantalum nitride, alloys therefore, and/or multi-layers thereof. The formation of contact plugs 30 may include forming contact openings in ILD 28, filling a conductive material(s) into the contact openings, and performing a planarization process such as a Chemical Mechanical Polish (CMP) process or a mechanical grinding process to level the top surfaces of contact plugs 30 with the top surface of ILD 28.

In subsequent discussion of the air spacers, the conductive features encircled by air spacers are in a dielectric layer over and contacting contact plugs 30 as an example. It is appreciated that air spacers and the conductive features encircled by the air spacers may be in any layer having conductive features, for example, in the layer having contact plugs as shown in FIG. 18.

Figure 2:
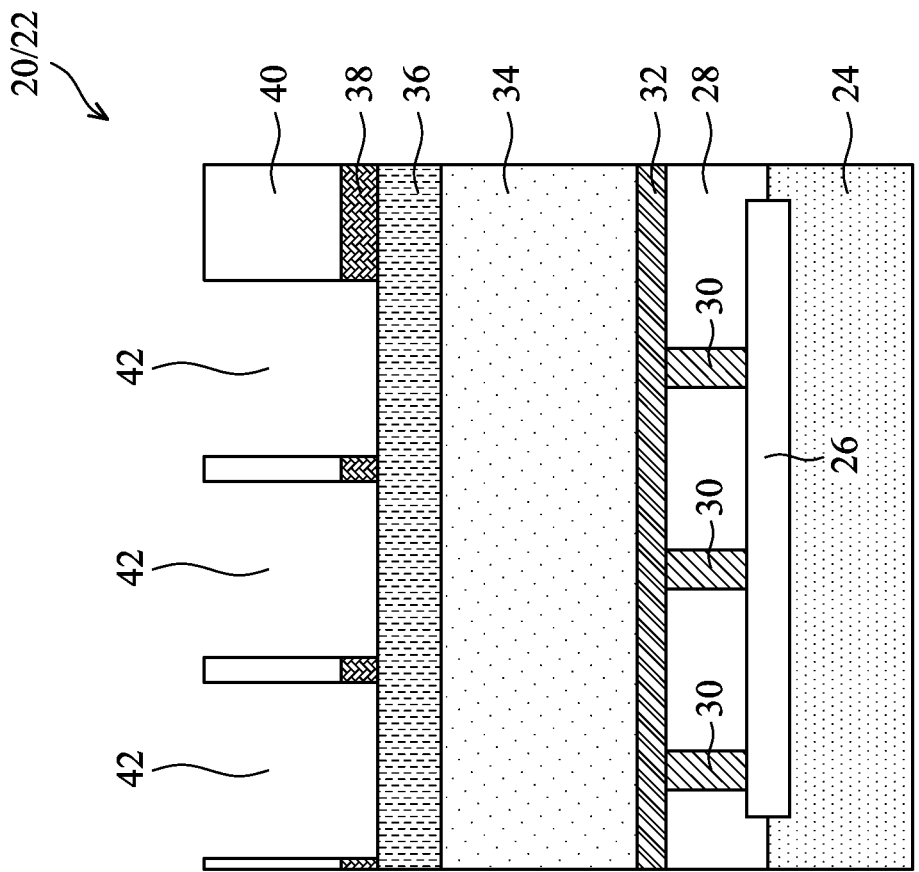

Referring to FIG. 2, etch stop layer 32 is formed over ILD 28 and contact plugs 30. The respective process is illustrated as process 202 in the process flow 200 as shown in FIG. 19. In accordance with some embodiments, etch stop layer 32 is in contact with the top surfaces of ILD 28 and contact plugs 30. In accordance with alternative embodiments, there is one or a plurality of dielectric layers and the corresponding conductive features (such as contact plugs, metal lines, vias, etc.) located between ILD 28 and etch stop layer 32. For example, there may be an additional etch stop layer(s), an additional ILD, low-k dielectric layers, etc., between ILD 28 and etch stop layer 32. Correspondingly, there may be contact plugs, vias, metal lines, etc., in the dielectric layers. Etch stop layer 32 may include silicon nitride (SiN), silicon carbide (SiC), silicon oxy-nitride (SiON), silicon oxy-carbide (SiOC), silicon Carbo-nitride (SiCN), or the like. Etch stop layer 32 may also include a metal oxide, a metal nitride, or the like. Etch stop layer 32 may be a single layer formed of a homogeneous material, or a composite layer including a plurality of dielectric sub-layers formed of different martials. In accordance with some embodiments of the present disclosure, etch stop layer 32 includes an aluminum nitride (AlN) layer, a silicon oxy-carbide layer over the aluminum nitride layer, and an aluminum oxide layer over the silicon oxy-carbide layer.

Further Referring to FIG. 2, dielectric layer 34 is deposited over etch stop layer 32. The respective process is illustrated as process 204 in the process flow 200 as shown in FIG. 19. Dielectric layer 34 may be an ILD layer, in which contact plugs are to be formed. Alternatively, dielectric layer 34 may be an Inter-Metal Dielectric (IMD) layer for forming metal lines. In accordance with some embodiments of the present disclosure, dielectric layer 34 is formed of or comprises a low-k dielectric material having a dielectric constant (k value) lower than 3.8, and the dielectric constant may also be lower than about 3.0 such as between about 2.5 and about 3.0. Dielectric layer may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layer 34 includes depositing a porogen-containing dielectric material, and then performing a curing process to drive out the porogen, and hence the remaining dielectric layer 34 is porous.

Pad layer 36 and hard mask 38 are formed on dielectric layer 34. The respective process is illustrated as process 206 in the process flow 200 as shown in FIG. 19. Pad layer 36 may be a thin film formed of or comprising silicon oxide. In accordance with some embodiments of the present disclosure, pad layer 36 is formed using Tetraethyl orthosilicate (TEOS) as a precursor, and the deposition process may include PECVD, CVD, Low-Pressure Chemical Vapor Deposition (LPCVD) or the like. Pad layer 36 acts as an adhesion layer between dielectric layer 34 and hard mask 38. Pad layer 36 may also act as an etch stop layer for etching hard mask 38. In accordance with some embodiments of the present disclosure, hard mask 38 is formed of tungsten doped carbide (WDC), silicon nitride, titanium nitride, boron nitride, or the like. The deposition method may include CVD, LPCVD, PECVD, or the like. Hard mask 38 is used as a hard mask during subsequent photolithography processes.

Further referring to FIG. 2, photo resist 40 is formed on hard mask 38 and is then patterned, forming openings 42 in photo resist 40. In a subsequent process, photo resist 40 is used to etch hard mask layer 38. The respective process is also illustrated as process 206 in the process flow 200 as shown in FIG. 19. Pad layer 36 may act as the etch stop layer for the etching process. Accordingly, pad layer 36 is exposed. After the etching process, photo resist 40 is removed, for example, in an ashing process.

Figure 3:
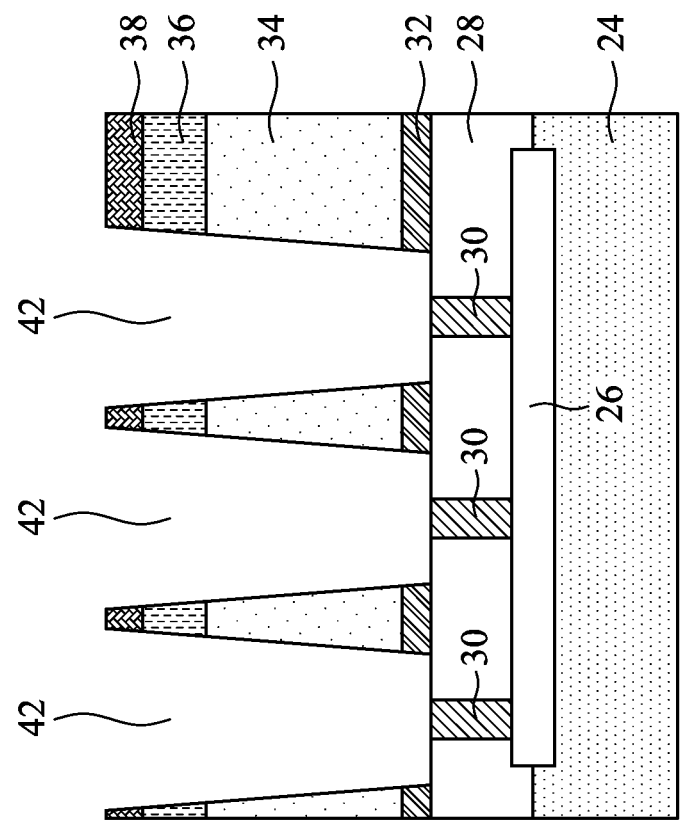

Next, referring to FIG. 3, pad layer 36 and dielectric layer 34 are etched using hard mask 38 as an etching mask, and openings 42 extend into dielectric layer 34. The respective process is illustrated as process 208 in the process flow 200 as shown in FIG. 19. The pad layer 36 may be etched through a dry etching process by using a mixture of $NF_3$ and $NH_3$ gases, the mixture of HF and $NH_3$ gases, or the like. Alternatively, pad layer 36 may be etched through a wet etching process by using, for example, an HF solution. In accordance with some embodiments of the present disclosure, the etching of dielectric layer 34 is performed using a process gas comprising fluorine and carbon, wherein fluorine is used for etching, with carbon having the effect of protecting the sidewalls of the dielectric layer 34, with the sidewalls facing via openings and trenches. For example, the process gases for the etching may include a fluorine and carbon containing gas(es) such as $C_4F_8$, $CH_2F_2$, $CH_4$, $CH_3F$, and/or $CF_4$, and a carrier gas such as Ar, $N_2$, or the like. The etching is anisotropic.

The etching of dielectric layer 34 stops on etch stop layer 32. Next, etch stop layer 32 is etched-through, and openings 42 further penetrate through etch stop layer 32. The respective process is also illustrated as process 208 in the process flow 200 as shown in FIG. 19. The etching chemical is selected according to the materials and the layers of etch stop layer 32. For example, when etch stop layer 32 comprises aluminum oxide, silicon oxycarbide, aluminum nitride, etc., etching gases such as $BCl_3$, $Cl_2$, $CF_4$, $CHF_3$, etc. may be used, and oxygen ($O_2$) may be added. After the etching of dielectric layer 34, the underlying conductive features (such as contact plugs 30 when etch stop layer 32 is immediately over contact plugs 30) are revealed.

In the example embodiments as shown in FIG. 3, the top surfaces of both of conductive features 30 and dielectric layer 28 are revealed to openings 42. In accordance with alternative embodiments, openings 42 are narrower than the respective conductive features 30, and hence the top surfaces of conductive features 30 are revealed, while the top surface of dielectric layer 28 is not revealed. The corresponding embodiments are also shown in FIG. 18 as an example, in which gate stack 92 and source/drain contact plugs 98 correspond to the conductive features 30.

Figure 4:
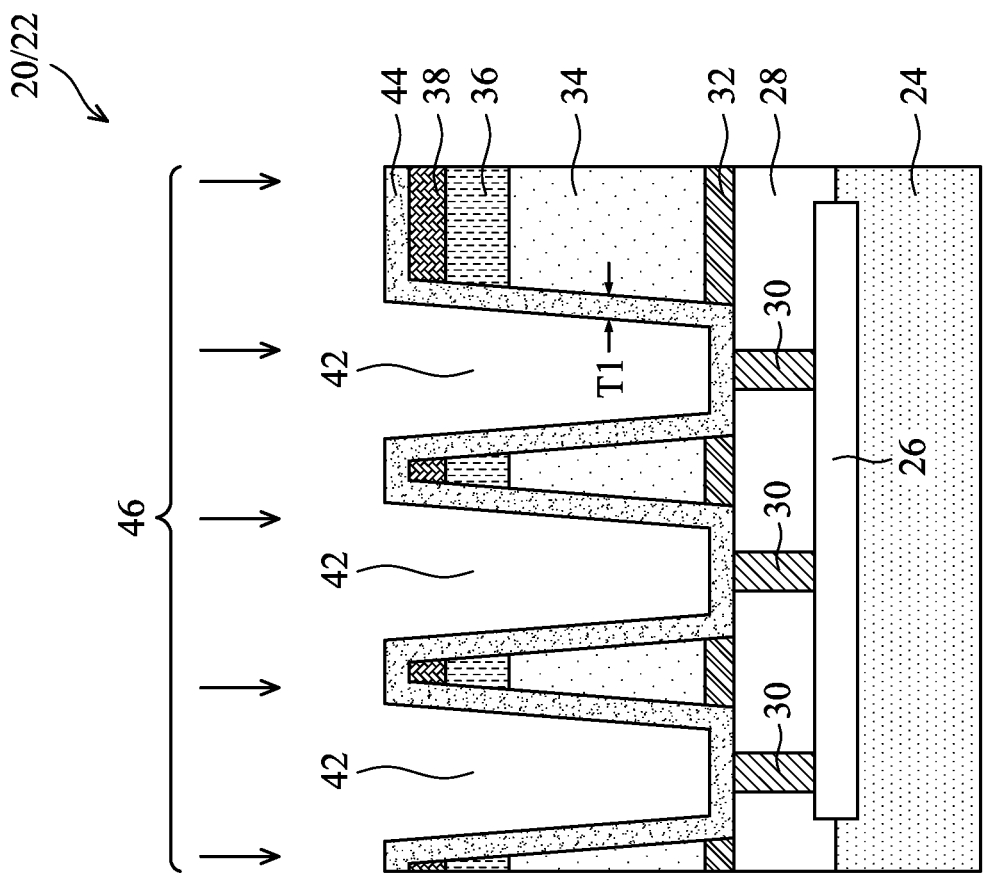

FIG. 4 illustrates the deposition of sacrificial layer 44. The respective process is illustrated as process 210 in the process flow 200 as shown in FIG. 19. In accordance with some embodiments, sacrificial layer 44 is formed of or comprises a material that can be selectively removed in a subsequent process, and does not react with the surrounding material. In accordance with some embodiments, sacrificial layer 44 may be formed of a semiconductor such as Si, or a dielectric material such as titanium oxide ($TiO_x$), aluminum oxide ($AlO_x$), silicon nitride, or the like. The deposition may be performed through a conformal deposition process such as CVD, ALD, Physical Vapor Deposition (PVD), PECVD, or the like. Accordingly, the horizontal portions and vertical portions of sacrificial layer 44 are equal to or substantially equal to each other, for example, with a thickness variation smaller than about 20 percent or 10 percent.

The desirable thickness T1 of sacrificial layer 44 is related to the position of dielectric layer 34. For example, when dielectric layer 34 is a lower IMD layer such as the layer including metallization layer M0, M1, etc., thickness T1 may be smaller, and when dielectric layer 34 is a higher IMD layer such as the layer for metallization layer M8, M9 or higher, thickness T1 may be greater. Similarly, the widths and the pitch of neighboring openings 42 also have smaller values when formed in lower layers, and greater values when formed in upper layers. In accordance with some embodiments, thickness T1 is in the range between about 10 Å and about 50 Å. The deposition time may be in the range between about 10 seconds and about 200 seconds. The deposition temperature may be in the range between about 25° C. and about 50° C.

Figure 5:
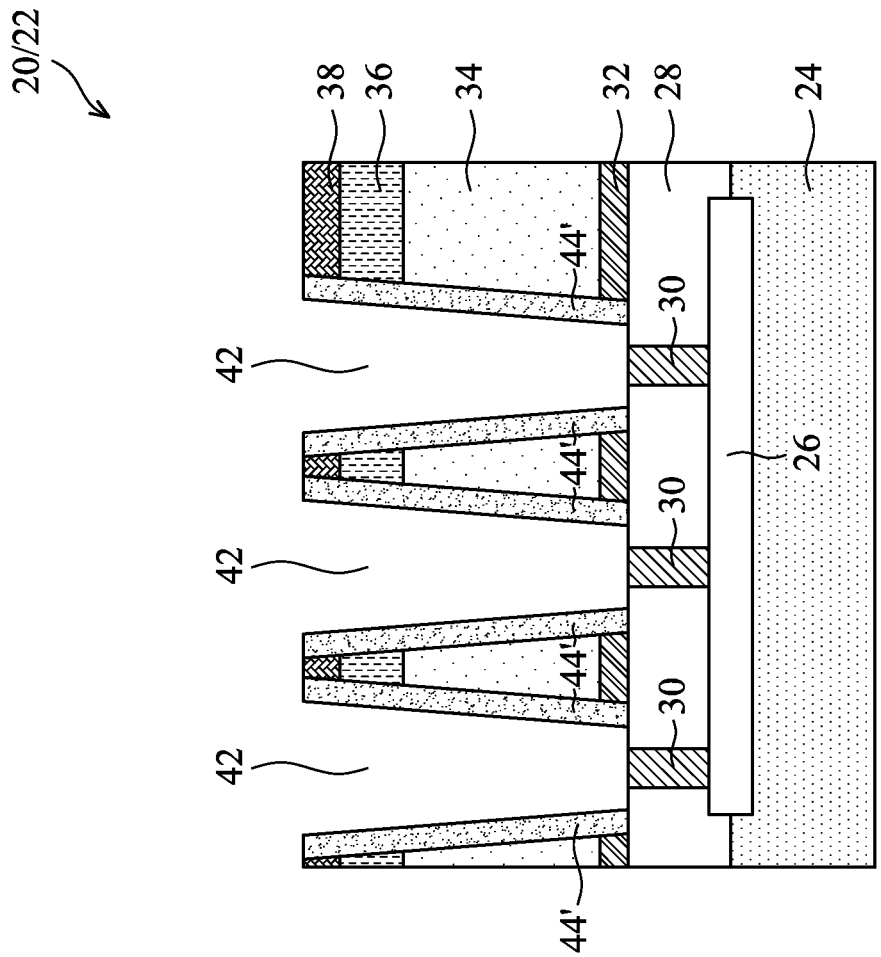

FIG. 4 also illustrates a first anisotropic etching process 46 for patterning sacrificial layer 44. Etching process 46 is performed after the deposition of sacrificial layer 44. The respective process is illustrated as process 212 in the process flow 200 as shown in FIG. 19. The resulting structure is shown in FIG. 5. In accordance with some embodiments, the etching is performed through a dry etching process, with directional plasma being generated from etching gases. The etching gases may include $Cl_2$, $CF_4$, $CHF_3$, $CH_4$, HBr, $CO_2$, $O_2$, etc., or combinations thereof, depending on the material of the sacrificial layer 44. Other gases such as $H_2$ and He may also be added. In accordance with some embodiments, the etching time may be in the range between about 10 seconds and about 50 seconds. The wafer temperature during the etching may be in the range between about 25° C. and about 60° C. As a result of the anisotropic etching process, the horizontal portions of sacrificial layer 44 are removed. Furthermore, at the bottoms of openings 42, conductive features 30 are exposed. The vertical portions of sacrificial layer 44 are left in openings 42 to form sacrificial rings 44', which encircle the remaining portions of openings 42. Sacrificial rings 44' contact the sidewalls of etch stop layer 32, dielectric layer 34, pad layer 36, and hard mask 38.

Figure 6:
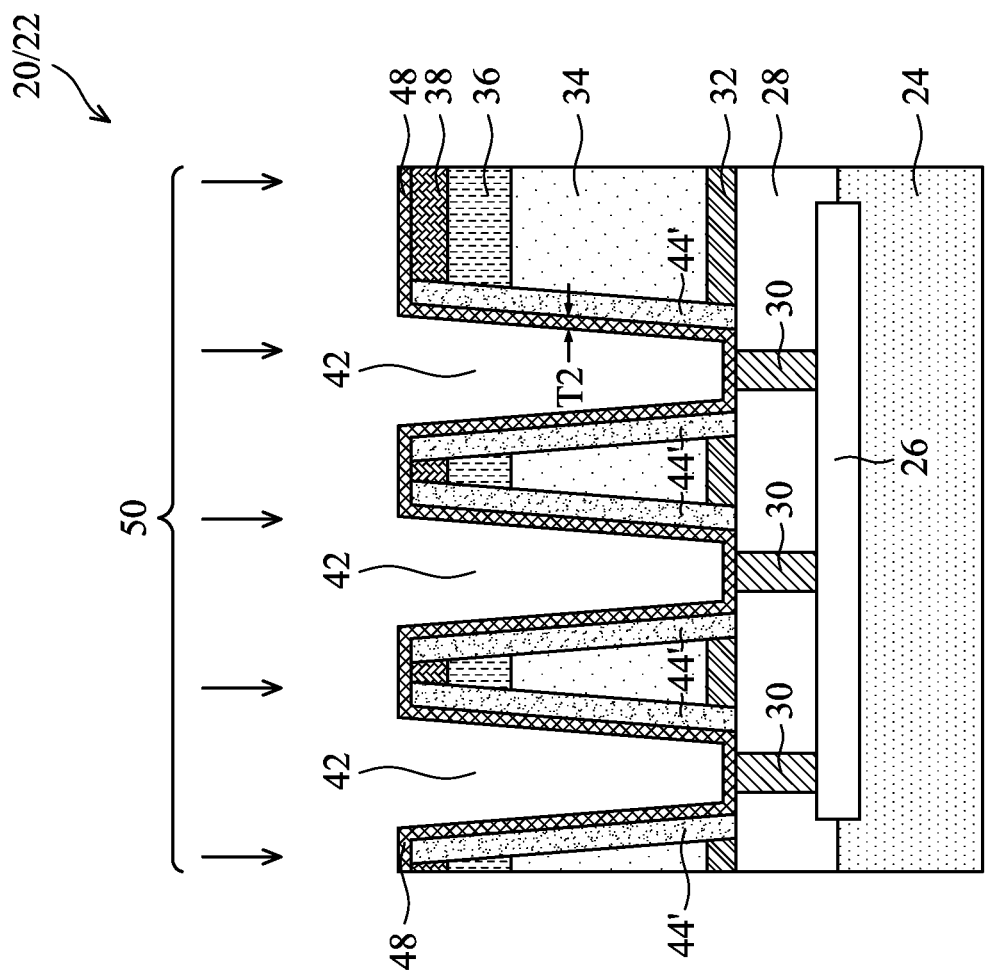

FIG. 6 illustrates the deposition of protection layer 48. The respective process is illustrated as process 214 in the process flow 200 as shown in FIG. 19. In accordance with some embodiments, protection layer 48 is formed of or comprises a material that is different from the material of sacrificial rings 44'. In accordance with some embodiments, protection layer 48 may be formed of a conductive material or a dielectric material. The conductive material may include TaN, TiN, or the like. The dielectric material may include an oxide such as a (low-temperature) silicon oxide, silicon nitride, silicon carbide, silicon oxycarbide, or the like. The thickness T2 of protection layer 48 may be in the range between about 20 Å and about 60 Å. The deposition may be performed through a conformal deposition process such as CVD, ALD, PVD, PECVD, or the like. Accordingly, the horizontal portions and the vertical portions of protection layer 48 are equal to or substantially equal to each other, for example, with a thickness variation smaller than about 20 percent or 10 percent. In accordance with some embodiments, the deposition time of protection layer 48 may be in the range between about 10 seconds and about 200 seconds. The deposition temperature may be higher than about 100° C., and may be in the range between about 120° C. and about 200° C.

Figure 7:
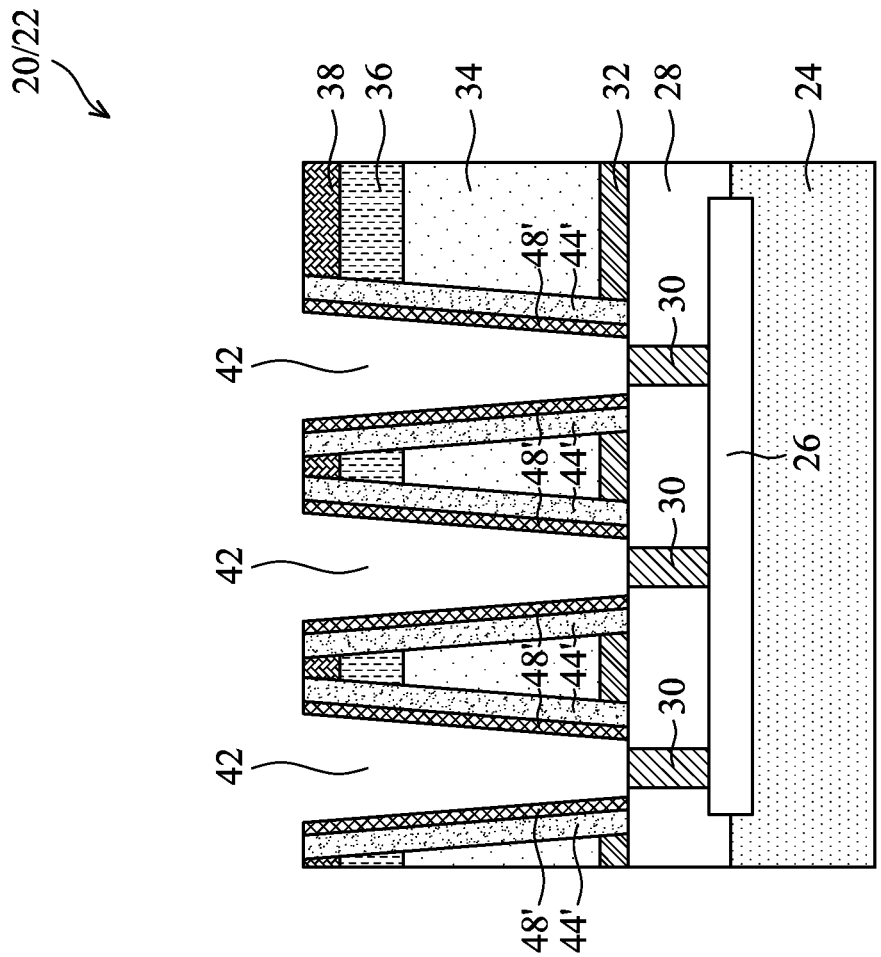

FIG. 6 also illustrates a second anisotropic etching process 50 performed after the deposition of protection layer 48 for patterning protection layer 48. The respective process is illustrated as process 216 in the process flow 200 as shown in FIG. 19. The resulting structure is shown in FIG. 7. In accordance with some embodiments, the etching is performed through a dry etching process, with directional plasma being generated from etching gases. The etching gases may include $Cl_2$, $CF_4$, $CHF_3$, $CH_4$, HBr, $CO_2$, $H_2$, $O_2$, etc., or combinations thereof, depending on the material of the protection layer 48. Other gases such as $H_2$ and He may also be added. As a result of the anisotropic etching process, the horizontal portions of protection layer 48 are removed. Furthermore, at the bottoms of openings 42, conductive features 3o are exposed. The vertical portions of protection layer 48 are left in openings 42 to form protection rings 48'. Since sacrificial layer 44 has been etched to reveal the top surfaces of underlying features such as contact plugs 30 and dielectric layer 28, protection rings 48' are able to extend to and contact the top surface of the underlying features such as conductive features 30 or dielectric layer 28. In accordance with some embodiments, the etching time may be in the range between about 10 seconds and about 50 seconds. The temperature of the wafer during the etching process may be in the range between about 25° C. and about 60° C.

Figure 8:
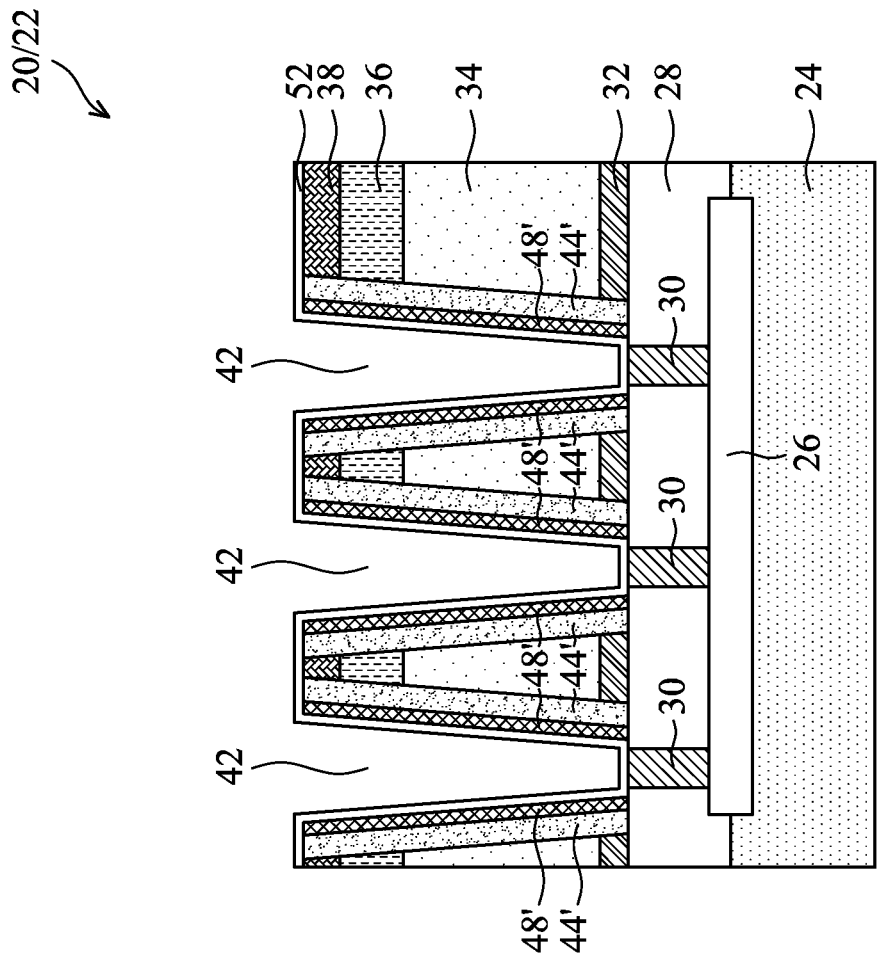
Figure 9:
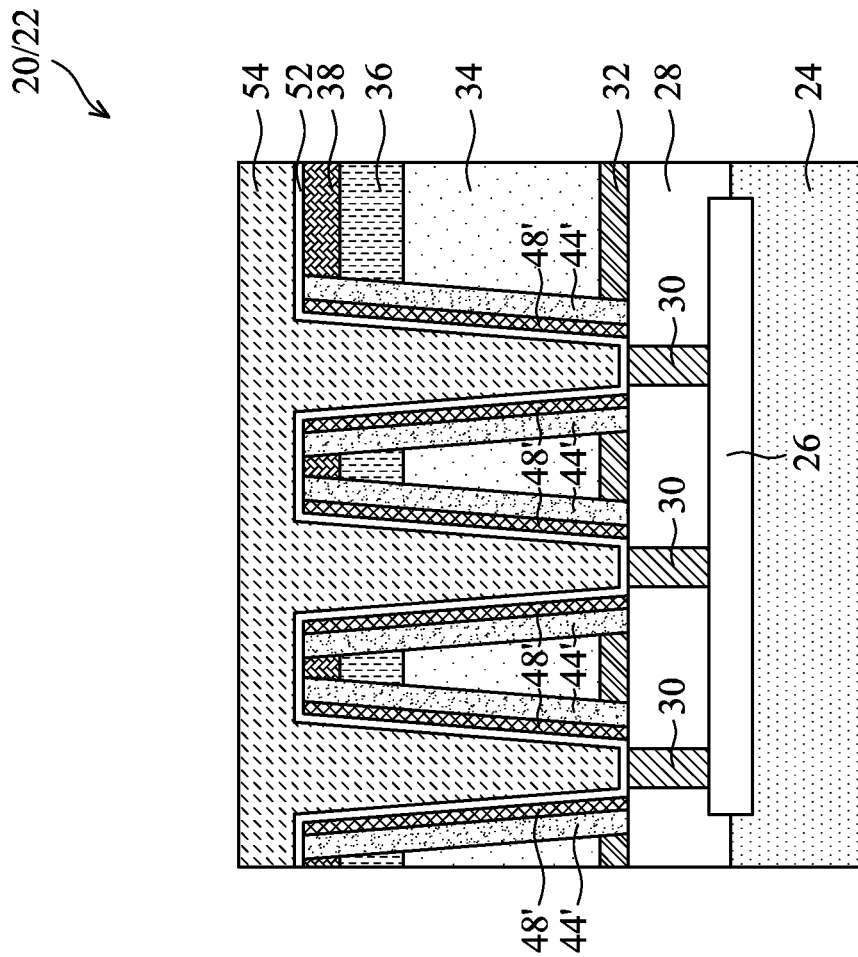
Figure 10:
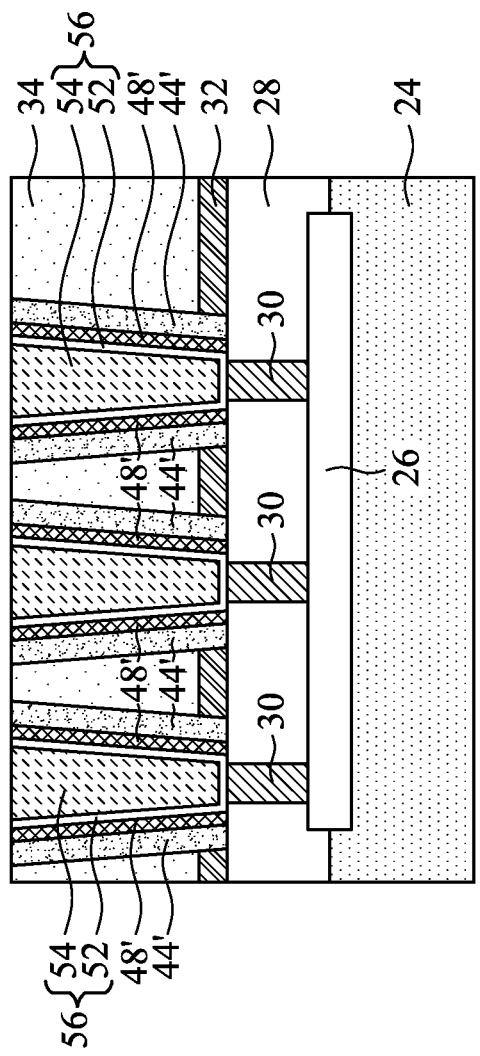

FIGS. 8 through 10 illustrate the formation of conductive features 56 (FIG. 10). Referring to FIG. 8, barrier layer 52 is deposited. The respective process is illustrated as process 218 in the process flow 200 as shown in FIG. 19. In accordance with some embodiments, barrier layer 52 is formed of or comprises titanium, titanium nitride, tantalum, tantalum nitride, or the like. Barrier layer 52 may be formed as a conformal layer, which may be deposited using CVD, ALD, PVD, or the like. After the formation of barrier layer 52, a metal seed layer (not shown) is formed. The metal seed layer may be formed of or comprise copper, and may be formed, for example, using PVD.

FIG. 9 illustrates the deposition of conductive material 54. The respective process is illustrated as process 220 in the process flow 200 as shown in FIG. 19. In accordance with some embodiments, conductive material 54 comprises copper or a copper alloy, cobalt, tungsten, aluminum, or the like, or combinations thereof. The deposition process may include Electro Chemical Plating (ECP), electroless plating, CVD, or the like. Conductive material 54 fully fills openings 42.

In accordance with alternative embodiments, instead of depositing both of the barrier layer 52 and conductive material 54, a single homogeneous material is deposited to fill openings 42, so that the resulting conductive features 56 are barrier-less.

Next, a planarization process such as a Chemical Mechanical Polish (CMP) process or a mechanical grinding process is performed to remove excess portions of the conductive material 54 and barrier layer 52. The respective process is illustrated as process 222 in the process flow 200 as shown in FIG. 19. The planarization process may be stopped on the top surface of dielectric layer 34, or on the top surface of pad layer 36. The planarization process may also be performed until a top portion of dielectric layer 34 is removed. The resulting structure is shown in FIG. 10. Throughout the description, the remaining portions of conductive material 54 and barrier layer 52 are collectively referred to as conductive features 56, which may be metal lines, metal vias, contact plugs, etc. Protection rings 48' encircle the corresponding conductive features 56, and sacrificial rings 44' encircle the corresponding protection rings 48'.

Figure 11A:
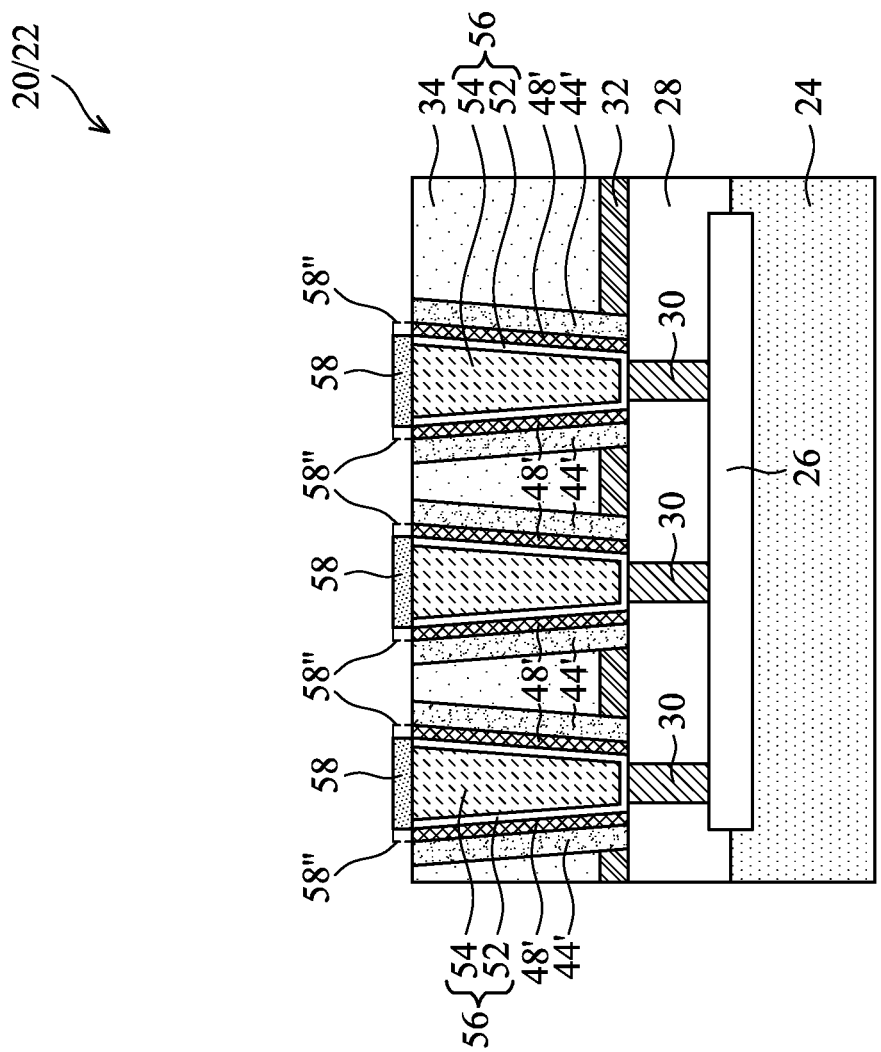

FIG. 11A illustrates the selective formation of metal caps 58. The respective process is illustrated as process 224 in the process flow 200 as shown in FIG. 19. In accordance with some embodiments, metal caps 58 are formed through a selective depositing process, so that metal caps 58 are selectively deposited on the exposed surfaces of conductive features 56, and not on the exposed surfaces of sacrificial rings 44' and dielectric layer 34. When protection rings 48' are formed of a conductive material, metal caps 58 may extends on protection rings 48', which extension portions are represented by dashed lines 58". Otherwise, when protection rings 48' are formed of a dielectric material, metal caps 58 may or may not extend on protection rings 48'. In accordance with these embodiments, the entirety of metal caps 58 is higher than the top surface of dielectric layer 34. The deposition process is controlled, for example, by controlling the thickness of metal caps 58, so that the lateral extensions of metal caps 58 do not extend on the top of sacrificial rings 44', or extend on the top of sacrificial rings 44' partially. After the formation of metal caps 58, there are enough parts of the top surface of sacrificial layer 44 remaining exposed. In accordance with some embodiments, the selective deposition process may be performed through ALD or CVD. In accordance with some embodiments, metal caps 58 are formed of or comprise cobalt (Co), tungsten (W), CoWP, CoB, tantalum (Ta), nickel (Ni), molybdenum (Mo), titanium (Ti), iron (Fe), or combinations thereof. When metal caps 58 are deposited, the precursor may include a metal halide (such as $WCl_5$) or a metal organic material and a reducing agent such as $H_2$.

Figure 12:
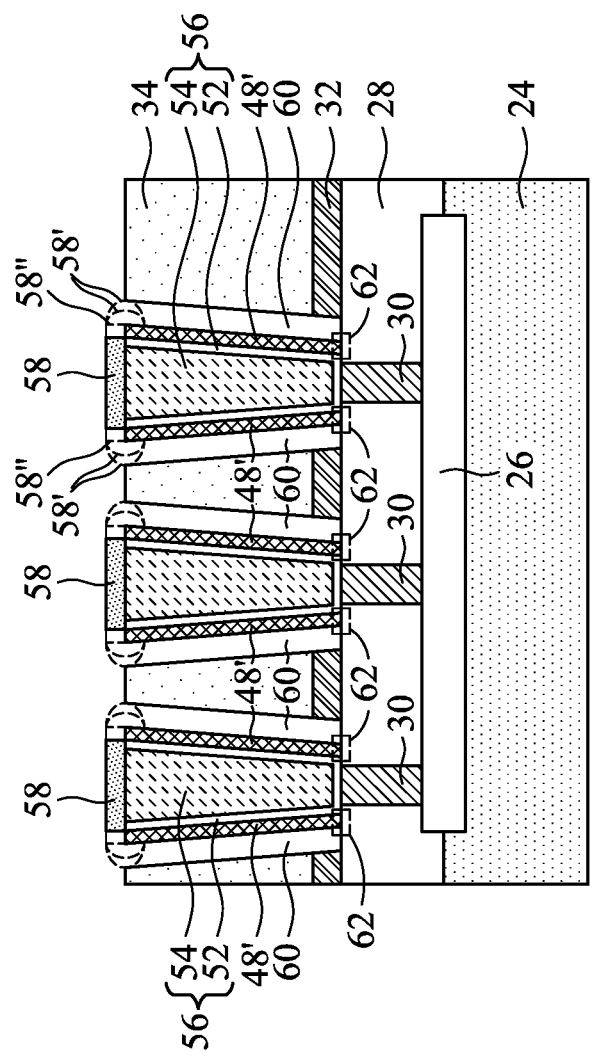

FIG. 12 illustrates the removal of sacrificial rings 44' to form air spacers 60. The respective process is illustrated as process 226 in the process flow 200 as shown in FIG. 19. Air spacers 60 have a substantially uniform thickness (lateral dimension) due to the conformity of sacrificial layer 44, for example, with the thicknesses of most parts of an air spacer having a variation smaller than about 20 percent. In accordance with some embodiments, sacrificial layer 44 is etched using an isotropic etching process, which may include a dry etching process and/or a wet etching process. For example, when a dry etching process is performed, the etching gas may include HF, $NF_3$, $O_2$, $CO_2$, $H_2$, $NH_3$, $Cl_2$, $C_xF_y$ (such as $CF_4$), $CHF_3$, $CH_4$, HBr, He, or the like, or combinations thereof, depending on the material of the sacrificial rings 44'. In accordance with some embodiments, the etching time of the dry etching process may be in the range between about 10 seconds and about 60 seconds. The temperature of the wafer during the etching process may be lower than about 60° C., and may be in the range between about 25° C. and about 60° C.

When a wet etching process is performed, the etching chemical may include a HF solution, ammonia water ($NH_4OH$), phosphoric acid, or the like. In accordance with some embodiments, the etching time of the wet etching process may be in the range between about 10 seconds and about 60 seconds. The temperature of the wafer in the etching process may be lower than about 50° C., and may be in the range between about 20° C. and about 50° C.

Figure 11B:
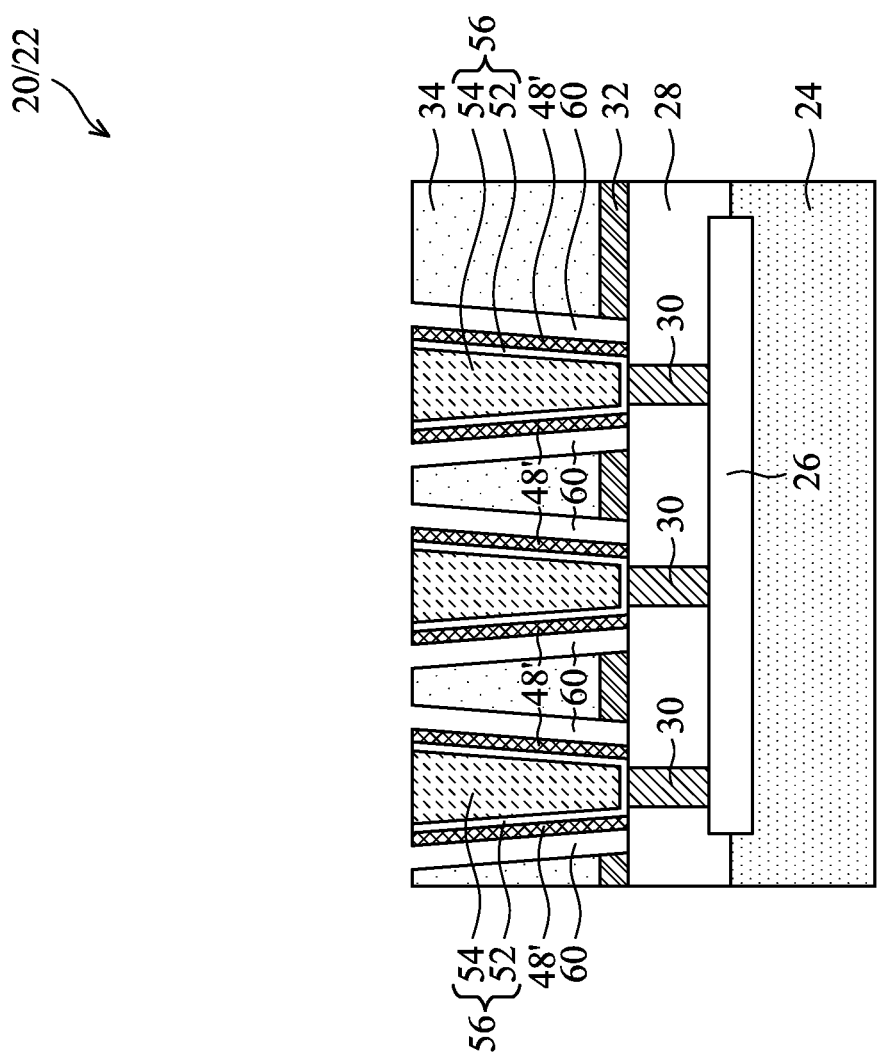

FIGS. 11A and 12 in combination disclose an embodiment in which metal caps 58 are formed first, followed by the formation of air spacers 60. In accordance with alternative embodiments, the removal of sacrificial rings 44' is performed first to form air spacers 60, followed by the formation of metal caps 58. This embodiment is shown in FIGS. 11B and 12 in combination. Referring to FIG. 11B, sacrificial rings 44' are removed to form air spacers 60. Metal caps 58 are then selectively deposited. The resulting structure is also shown in FIG. 12.

In accordance with some embodiments, metal caps 58 are limited in the regions directly over conductive features 56 when the embodiments shown in FIG. 11A are adopted. When the embodiments shown in FIG. 11B are adopted, metal caps 58 may or may not include portions extending sideways slightly to form overhangs. The overhangs may contact the top portions of the sidewalls of conductive features 56, which sidewalls face air spacers 60. For example, FIG. 12 schematically illustrates dashed lines 58', which represent the extension portions of metal caps 58. The extension portions 58' of metal caps 58 may extend into the top portions of air spacers 60. Furthermore, extension portions 58' may be spaced part from dielectric layer 34, or may extend far enough to contact the nearest portion of dielectric layer 34. Accordingly, metal caps 58 may leave air spacers 60 opened, or may partially or fully seal air spacers 60.

Air spacers 60 have k values equal to 1.0, which is smaller than other dielectric materials, even low-k dielectric materials. With the formation of air spacers, the parasitic capacitance between neighboring conductive features 56 is reduced.

As shown in FIG. 12, air spacers 60 may extend to the top surface of the underlying features such as dielectric layer (such as ILD 28) and conductive features (such as contact plugs 30). Since the horizontal portions of sacrificial layer 44 are removed (in FIG. 5) before the deposition of protection layer 48 (in FIG. 6), protection layer 48 does not extend on the horizontal portions of sacrificial layer 44. Accordingly, protection rings 48' may extend all the way to the top surface of the underlying features such as contact plugs 30 (when contact plugs 30 are wide enough) or dielectric layer 28. As a result, in the structure shown in FIG. 12, protection rings 48' fully protect the sidewalls of barrier layer 52, and no portion of barrier layer 52 is exposed to air spacers 60. Oxygen thus cannot access the bottom portion of barrier layer 52 to oxidize it.

As a comparison, if the horizontal portions of both of sacrificial layer 44 and protection layer 48 are removed after the deposition of protection layer 48, the bottom portions of protection layer 48 in the dashed regions 62 will be replaced by some horizontal portions of sacrificial layer 44. As a result, after the removal of sacrificial layer 44, the portions of sacrificial layer 44 in dashed regions 62 will also be removed. The sidewalls of the bottom portions of barrier layer 52 would have been exposed to oxygen and the chemical for removing sacrificial rings 44', resulting in oxidation and damage, hence the increase in the resistance of the conductive features and degradation in the performance of the resulting circuits.

In accordance with some embodiments, after the removal of sacrificial rings 44', a purging process is performed using a process gas. In accordance with some embodiments, the process gas may include argon, $N_2$, and/or the like. The purging process may be performed for a period of time in the range between about 1 minute and about 10 minutes. In addition, a thermal anneal process may be performed, which may be performed at the same time as the purging process, or before or after the purging process. In the thermal anneal, the wafer temperature may be in the range between about 300° C. and about 400° C. The purging process may remove moisture and prevent the oxidation of metal such as the bottom portion of barrier layer 52.

Figure 13:
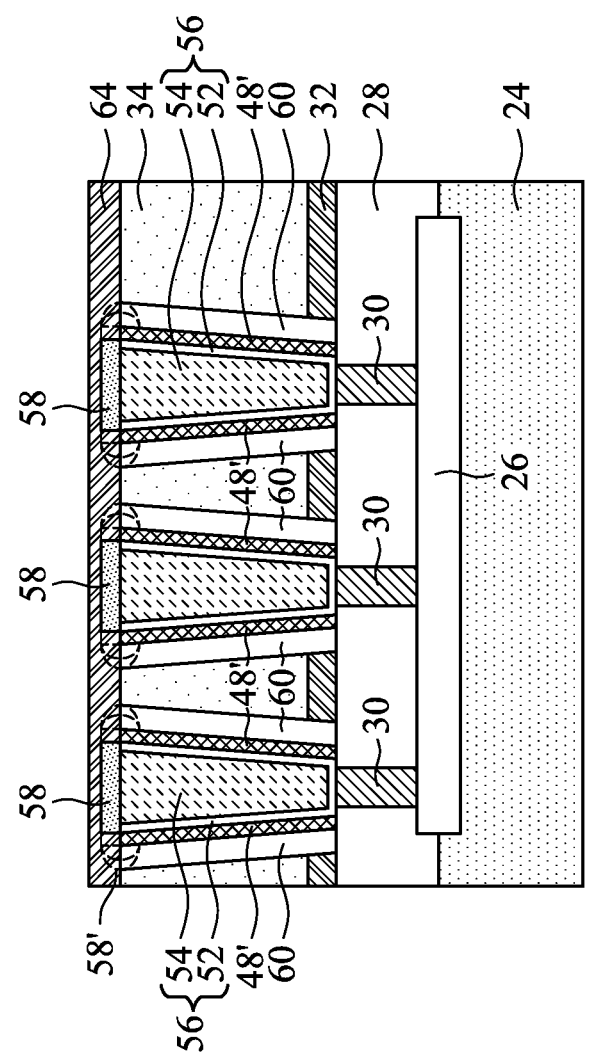

FIG. 13 illustrates the formation of etch stop layer 64. The respective process is illustrated as process 228 in the process flow 200 as shown in FIG. 19. Etch stop layer 64 contacts metal caps 58, and seals air spacer 60 (if not sealed already). In accordance with some embodiments, etch stop layer 64 may be formed of a material selected from SiN, SiC, SiON, SiOC, SiCN, or combinations thereof. Etch stop layer 64 may also include a metal oxide, a metal nitride, or the like. Etch stop layer 64 may be a single layer formed of a homogeneous material, or a composite layer including a plurality of dielectric sub-layers. In accordance with some embodiments of the present disclosure, etch stop layer 64 is a composite layer, which may include an AlN layer, a SiOC layer over the AlN layer, and an $AlO_x$ layer over the SiOC layer. The bottom layer such as the AlN layer may prevent copper extrusion, and the upper layers are used for stop etching.

Figure 14:
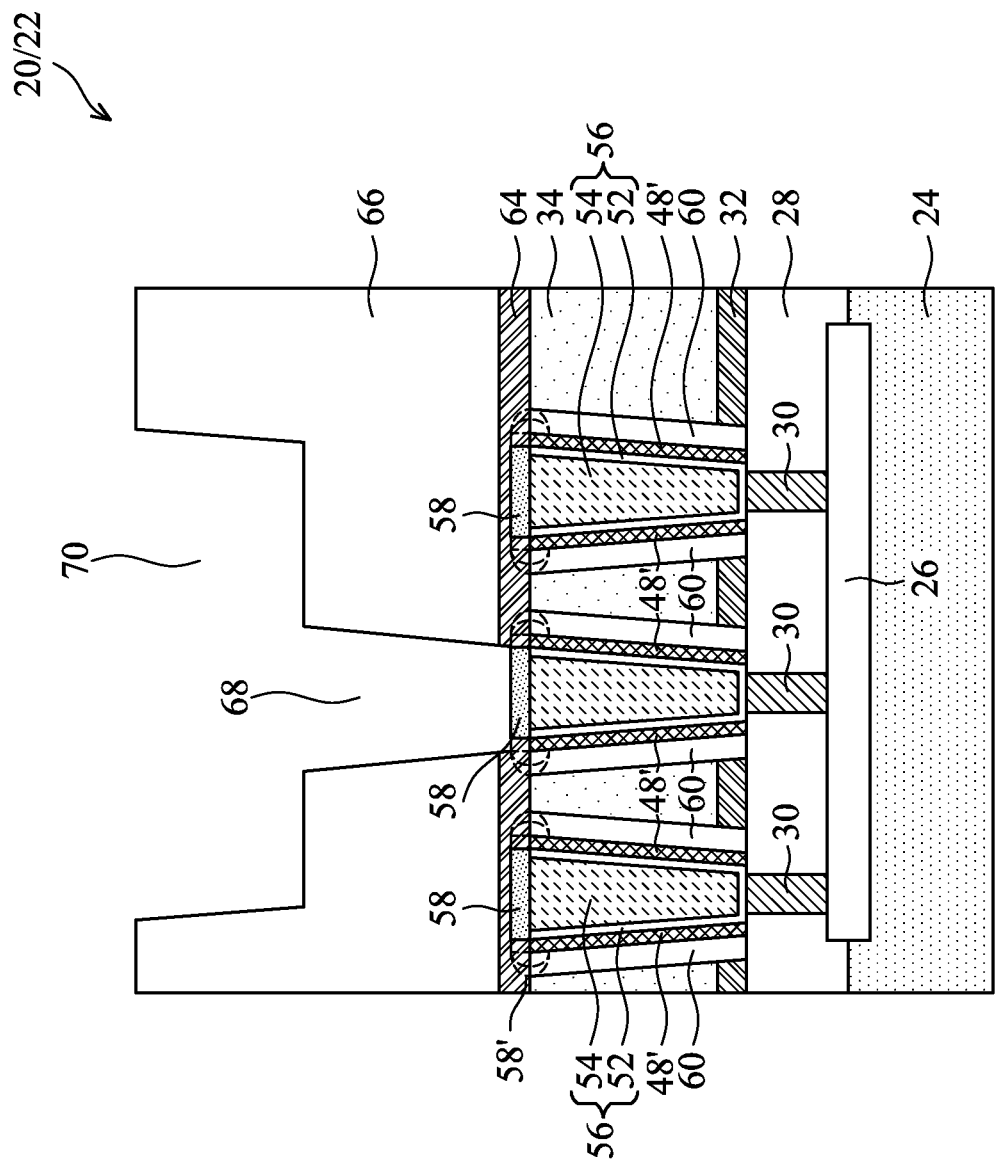
Figure 15:
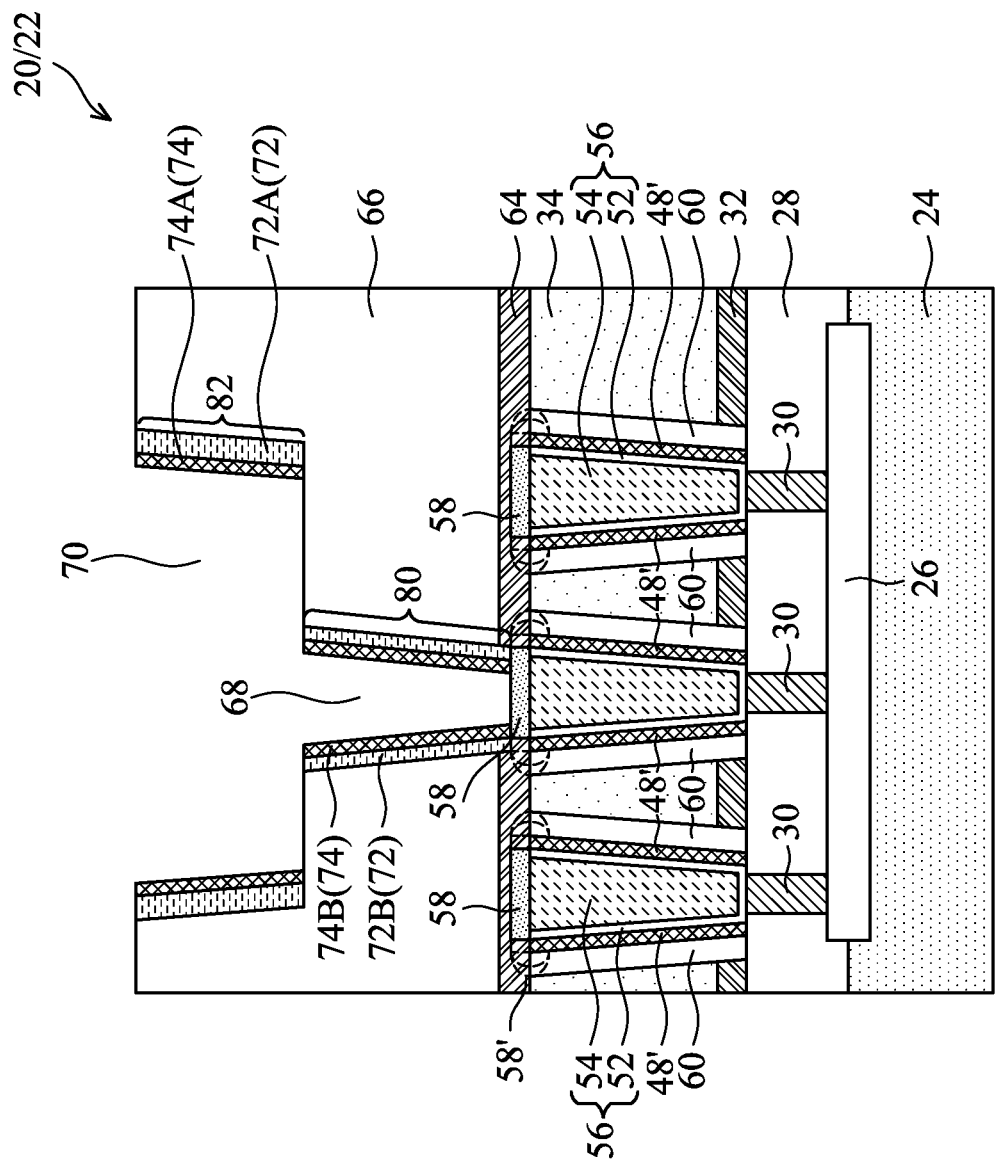
Figure 16:
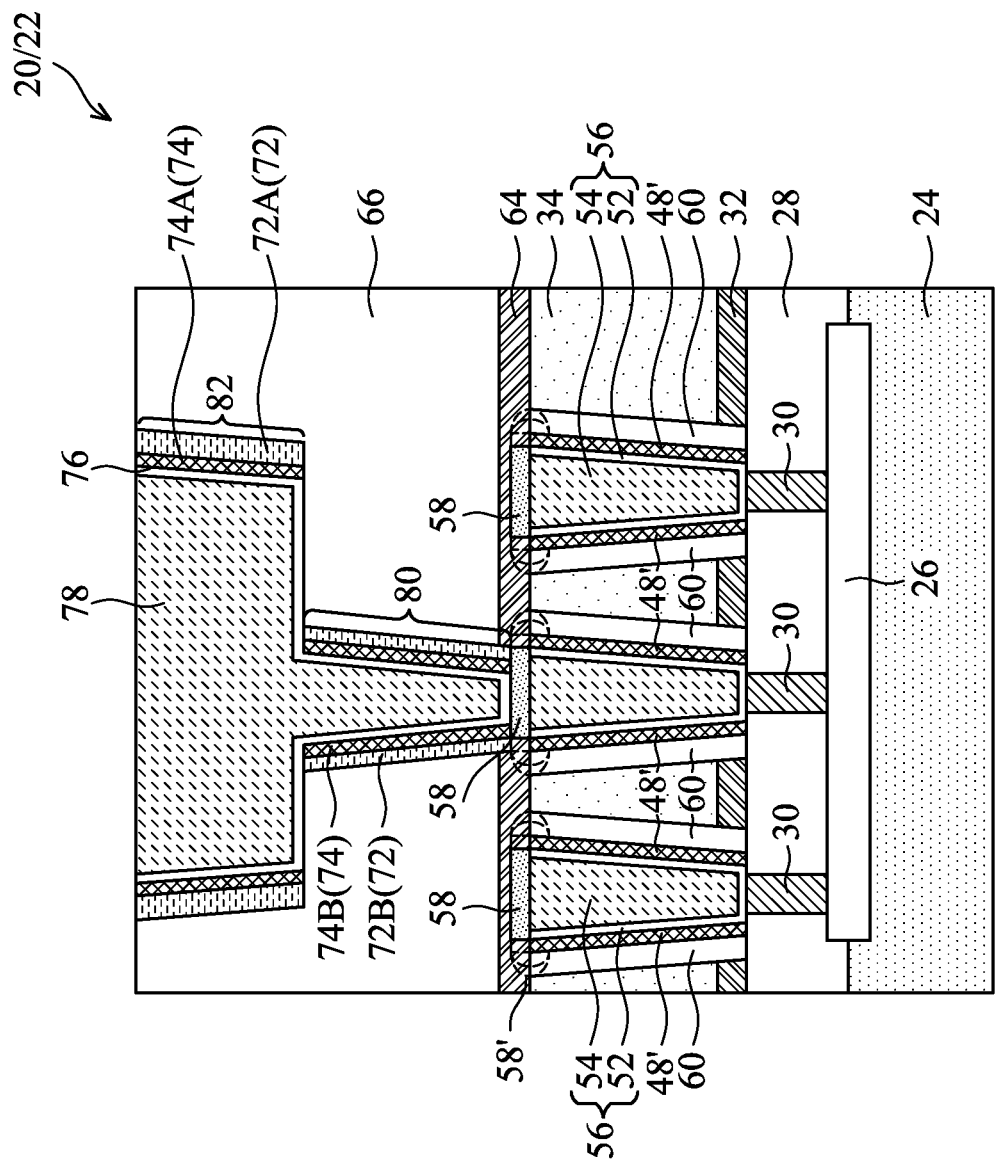

FIGS. 14 through 16 illustrate the formation of a dual damascene structure in accordance with some embodiments. Referring to FIG. 14, dielectric layer 66 is deposited. The respective process is also illustrated as process 228 in the process flow 200 as shown in FIG. 19. Dielectric layer 66 may be formed of a low-k dielectric material, which may be selected from the same (or different) group of candidate materials for forming dielectric layer 34. Trench 70 and via opening 68 are formed in dielectric layer 66. The respective process is illustrated as process 230 in the process flow 200 as shown in FIG. 19. In accordance with some embodiments of the present disclosure, a metal hard mask (not shown) is formed and patterned to define the patterns of trench 70. A photo lithography process is performed to etching dielectric layer 66 in order to form a via opening. The via opening extends from the top surface of dielectric layer 66 to an intermediate level between the top surface and the bottom surface of dielectric layer 66. An anisotropic etching process is then performed to etch dielectric layer 66 and to form trench 70 using the metal hard mask as an etching mask. At the same time trench 70 is formed, the via opening extends downwardly to metal cap 58, hence forming via opening 68. The etching for forming trench 70 may be performed using a time-mode. In accordance with alternative embodiments, via opening 68 and trench 70 are formed in separate photo lithography processes. For example, in a first photo lithography process, via opening 68 is formed extending down to metal cap 58. In a second lithography process, trench 70 is formed.

Referring to FIG. 15, a patterned sacrificial layer 72, which includes sacrificial rings 72A and 72B, is formed. The respective process is illustrated as process 232 in the process flow 200 as shown in FIG. 19. The formation process of sacrificial layer 72 includes depositing a conformal sacrificial layer, and then performing an anisotropic etching process to remove the horizontal portions of the conformal sacrificial layer. The candidate materials and the process details are essentially the same as what have been discussed referring to FIGS. 4 and 5, and are not repeated herein. Sacrificial layer 72 includes a first vertical portion in trench 70 to form a first ring 72A, and a second vertical portion in via opening 68 to form a second ring 72B. The first ring 72A is larger than, and is disconnected from, the second ring 72B.

After the formation of the patterned sacrificial layer 72, a patterned protection layer 74 is formed. The respective process is illustrated as process 234 in the process flow 200 as shown in FIG. 19. The formation process of protection layer 74 also includes depositing a conformal protection layer, and then performing an anisotropic etching process to remove horizontal portions of the conformal protection layer. The candidate materials and the process details are essentially the same as what have been discussed referring to FIGS. 6 and 7, and are not repeated herein. Protection layer 74 includes a first vertical portion in trench 70 to form a first ring 74A, and a second vertical portion in via opening 68 to form a second ring 74B. The first ring 74A is larger than the second ring 74B, and is disconnected from the second ring 74B.

Next, referring to FIG. 16, diffusion barrier 76 and metallic material 78 are deposited. The materials and the formation processes are similar to what have been discussed referring to FIGS. 9 and 10, and the details are not repeated herein. After the deposition of diffusion barrier 76 and metallic material 78, a planarization process is performed, forming via 80 and metal line 82, which include diffusion barrier 76 and metallic material 78. The respective process is illustrated as process 236 in the process flow 200 as shown in FIG. 19. Each of via 80 and metal line 82 is encircled by a protection ring and a sacrificial ring.

Figure 17A:
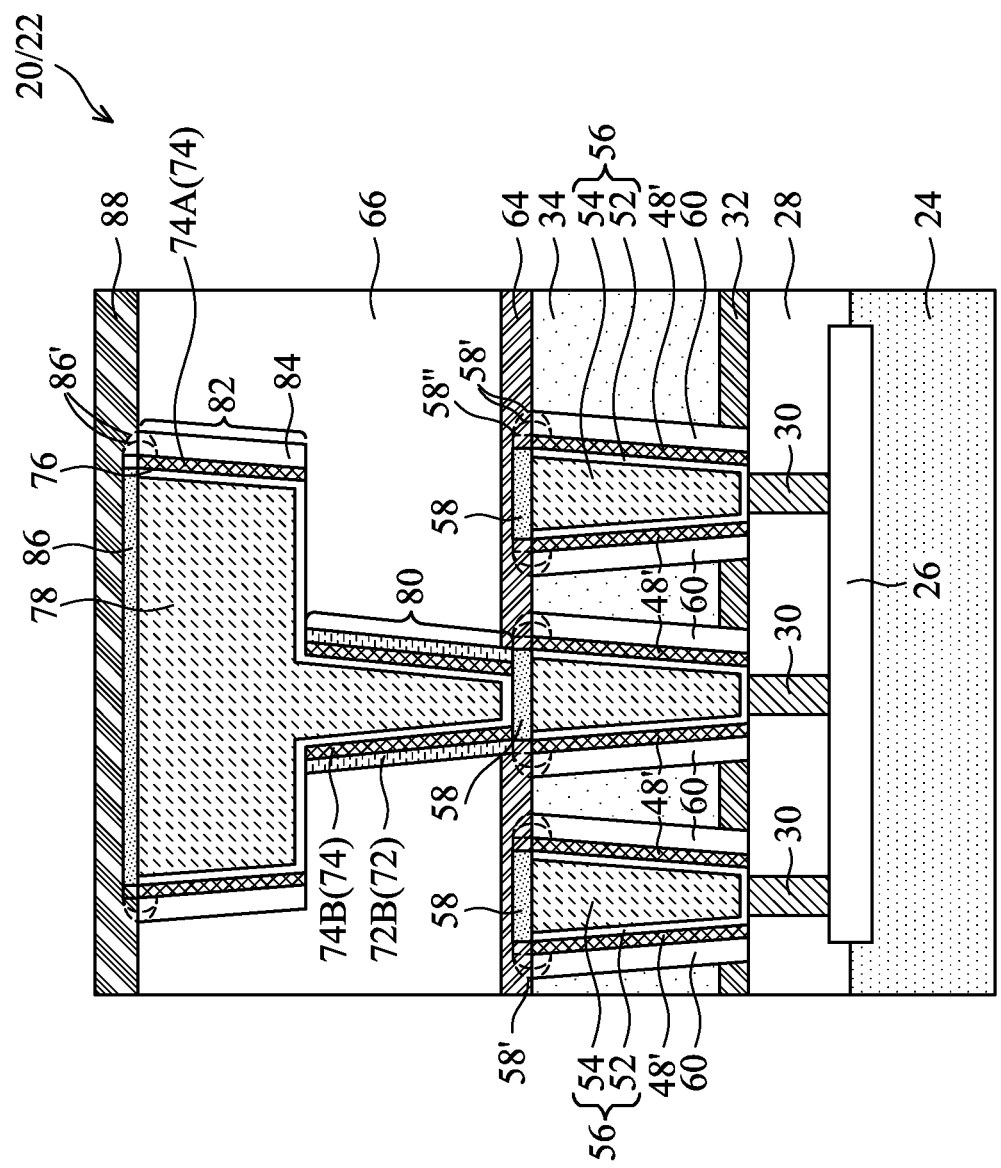

FIG. 17A illustrates the removal of sacrificial ring 72A, forming air spacer 84, which is a ring when viewed from the top of wafer 20. The respective process is illustrated as process 238 in the process flow 200 as shown in FIG. 19. The removal may also be performed through an isotropic etching process. The resulting air spacer 84 may extend to, and may be exposed to, the top surface of the underlying portion of dielectric layer 66. Protection ring 74A extends to the top surface of the lower portion of dielectric layer 66, and hence prevents the bottom portion of barrier layer 76 in metal line 82 from being oxidized.

Since sacrificial ring 72B cannot be removed, sacrificial ring 72B will be left in the final structure. It is appreciated that sacrificial ring 72B will result in increased parasitic capacitance compared to air spacers and low-k dielectric material. Vias 80, however, are laterally short, and are most likely to have longer distances from neighboring vias. Accordingly, the adverse increase in the parasitic capacitance is smaller compared to the reduction in parasitic capacitance due to the formation of air spacers 84. Alternatively stated, the reduction in the parasitic capacitance more than offsets the increase in the parasitic capacitance.

FIG. 17A further illustrates the formation of metal cap 86, which may be formed of a material and a method selected from the same group of candidate materials and candidate methods, respectively, for forming metal caps 58. Metal cap 86 may be formed before or after the formation of air spacers 84, which is similar to the embodiments as shown in FIGS. 11A and 11B. Also, when metal cap 86 is formed after the formation of air spacers 84, extension portions 86' (of metal cap 86) may be formed and extend below the top surface of dielectric layer 66. Alternatively, when metal cap 86 is formed before the formation of air spacers 84, an entirety of sacrificial layer 72, including the extension portions 86' that is directly over air spacers 84, will not extend below the top surface of dielectric layer 66. Etch stop layer 88 may then be deposited.

Figure 17B:
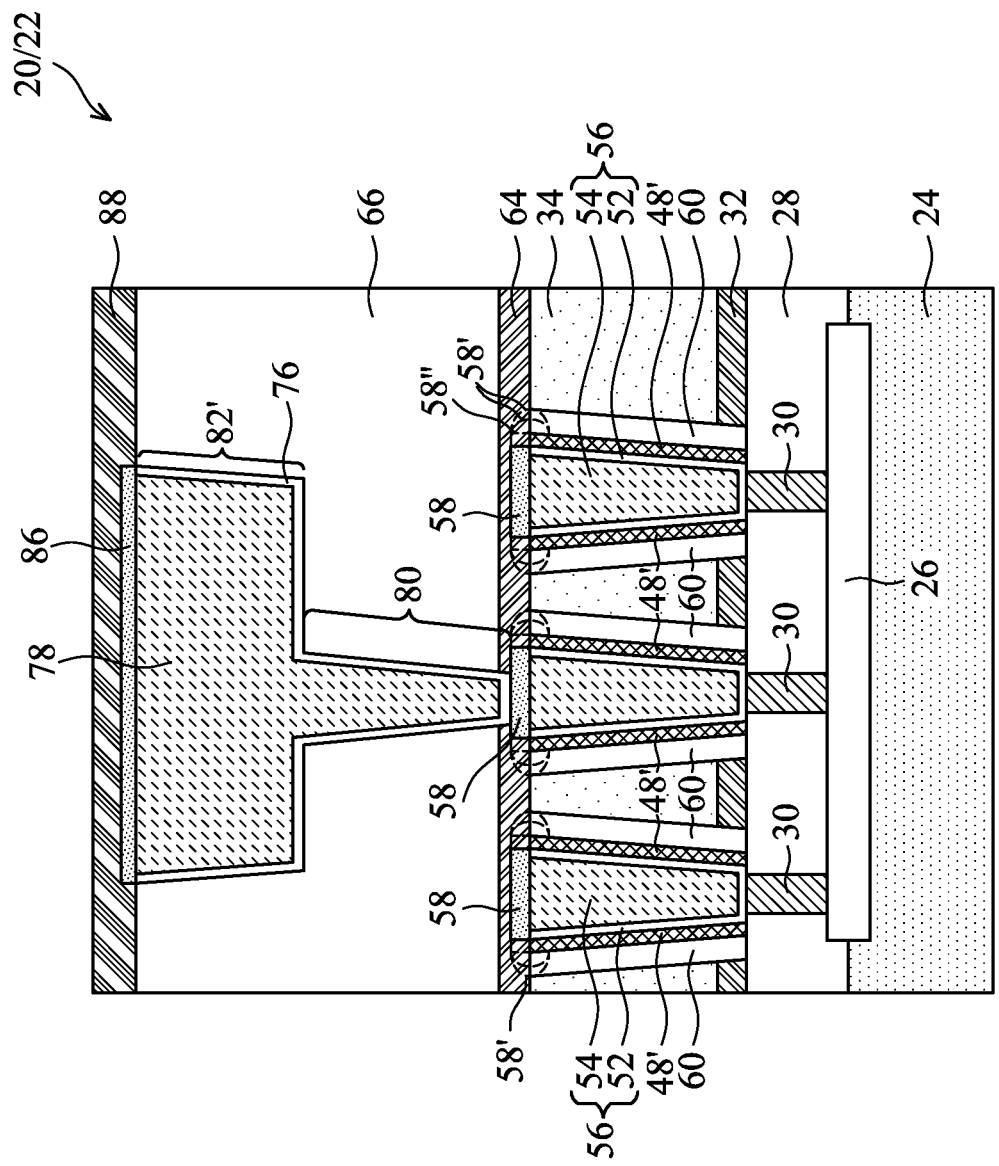
FIG. 17B illustrates the cross-sectional view of a dual damascene structure without being surrounded by an air spacer in accordance with some embodiments.

FIG. 17B illustrates the formation of air-gap-free via 80' and metal line 82' in accordance with alternative embodiments. These embodiments are similar to the embodiments as shown in FIG. 15A, except that no sacrificial layer and protection layer are formed for vias 80' and metal line 82', and accordingly, no air spacers are formed. Via 80' and metal line 82' are thus in physical contact with the sidewalls of the surrounding dielectric layer 66. It is appreciated that although FIG. 17B illustrates that air-gap-free via 80' and metal line 82' are immediately over conductive features 56, in accordance with alternative embodiments, the air spacer 84 as shown in FIG. 17A may be formed in the dielectric layer immediately over dielectric layer 34, while the air-gap-free via 80' and metal line 82' are formed in the dielectric layers over the layer in which air spacer 84 is formed. This is due to that parasitic capacitance problem is less severe in upper metal layers than in lower metal layers, and hence air spacers are formed in lower metal layers, but not in upper metal layers.

Figure 17C:
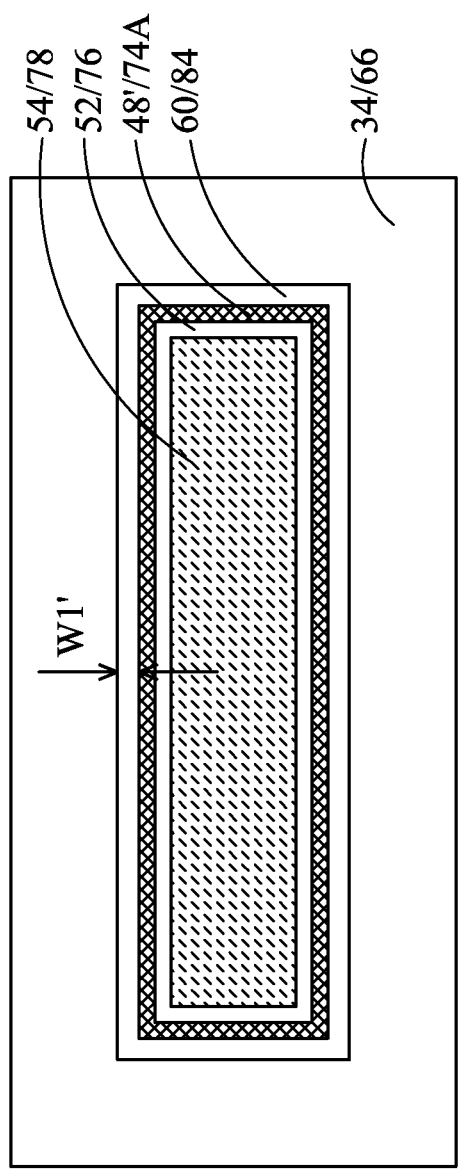
FIG. 17C illustrates a top view of an air spacer in accordance with some embodiments.

FIG. 17C illustrates a top view of air spacer 60 or 84, protection layer 48' or 74A, and the corresponding conductive features 56 or 82 in accordance with some embodiments. As shown in FIG. 17C, air spacer 60 or 84 may form a full ring encircling the corresponding conductive feature 56/82. Air spacer 60 or 84 may have a substantially uniform width W1' (for example, with variation being smaller than about 10 percent). The width W1' may be measured at the middle height of the corresponding air spacers 60 and 84. The width W1' of air spacer 60 may be the same as or different from the width W1' of air spacer 84. Furthermore, when viewed from a cross-sectional view, air spacer 60 may have a substantially uniform width (for example, with variation smaller than about 20 percent or smaller than about 10 percent) from top to bottom, and air spacer 84 may have a substantially uniform width (for example, with variation smaller than about 20 percent or smaller than about 10 percent) from top to bottom.

FIG. 18 illustrates the formation of air spacers surrounding contact plugs, which are over and contacting source/drain contact plugs 98 and gate stack 92. In accordance with some embodiments, transistor 90 is formed at the top surface of semiconductor substrate 24. Transistor 90 includes gate stack 92 and source/drain regions 94. Source/drain silicide regions 96 are formed over and contacting source/drain regions 94. Source/drain contact plugs 98 are formed over and connected to silicide regions 96. Conductive features 56 are formed over and connected to gate stack 92 and source/drain contact plugs 98 in accordance with some embodiments, with air spacers 60 surrounding conductive features 56.

The embodiments of the present disclosure have some advantageous features. By forming air spacers, the parasitic capacitance between neighboring conductive features may be reduced. By performing an anisotropic etching process on a sacrificial layer before the deposition and the anisotropic etching of a protection layer, the protection layer may extend to the top surface of the underlying features without leaving any gap in between. This prevents the oxidation and the damage of the bottom portions of conductive features such as the barrier layers of the conductive features.

In accordance with some embodiments of the present disclosure, a method includes etching a dielectric layer to form an opening, wherein a first conductive feature underlying the dielectric layer is exposed to the opening; depositing a sacrificial spacer layer extending into the opening; performing a first etching process to etch the sacrificial spacer layer, wherein a first bottom portion of the sacrificial spacer layer at a bottom of the opening is removed to reveal the first conductive feature, and a first vertical portion of the sacrificial spacer layer in the opening and on a sidewall of the dielectric layer is left to form a sacrificial ring; depositing a protection layer extending into the opening and on the sacrificial ring; performing a second etching process to etch the protection layer, wherein a second bottom portion of the protection layer is removed to reveal the first conductive feature, and a second vertical portion of the protection layer in the opening is left to form a protection ring; forming a second conductive feature in the opening, wherein the second conductive feature is encircled by the sacrificial ring, and is over and electrically coupled to the first conductive feature; and removing the sacrificial ring to form an air spacer. In an embodiment, the depositing the sacrificial spacer layer comprises a conformal deposition process. In an embodiment, the method further includes forming a metal capping layer over the second conductive feature, wherein the metal capping layer comprises an extension portion extending into the air spacer. In an embodiment, the first etching process and the second etching process comprise anisotropic etching processes. In an embodiment, the depositing the sacrificial spacer layer comprises depositing a silicon layer. In an embodiment, after the opening is formed, a top surface of an underlying feature is exposed, and wherein the protection ring comprises a bottom surface in physical contact with the top surface. In an embodiment, the protection ring comprises a dielectric material. In an embodiment, the protection ring comprises a conductive material. In an embodiment, the forming the second conductive feature comprises depositing a conductive barrier layer extending into the opening and contacting the protection ring; and depositing a conductive region on the conductive barrier layer. In an embodiment, the second conductive feature is fully separated from the air spacer by the protection ring. In an embodiment, the opening comprises a trench and a via opening underlying the trench, and the sacrificial ring is in the trench, and the first etching process further forms an additional sacrificial ring in the via opening. In an embodiment, the protection ring comprises a sidewall facing the air spacer.

In accordance with some embodiments of the present disclosure, a structure includes a first conductive feature; a first etch stop layer over the first conductive feature; a dielectric layer over the first etch stop layer; a second conductive feature in the dielectric layer and the first etch stop layer, wherein the second conductive feature is over and contacting the first conductive feature; an air spacer encircling the second conductive feature, wherein sidewalls of the second conductive feature are exposed to the air spacer; and a protection ring encircling the second conductive feature, wherein the protection ring fully separates the second conductive feature from the air spacer. In an embodiment, the structure further comprises an additional dielectric layer, wherein the first conductive feature is in the additional dielectric layer, and wherein the protection ring has a bottom surface in contact with at least one of the first conductive feature and the additional dielectric layer. In an embodiment, the structure further comprises a second etch stop layer over and contacting the dielectric layer and the second conductive feature. In an embodiment, the protection ring fully separates the second conductive feature from the air spacer, with no portion of the second conductive feature being exposed to any portion of the air spacer. In an embodiment, the protection ring comprises a conductive material.

In accordance with some embodiments of the present disclosure, a structure comprises a first dielectric layer; a first conductive feature in the first dielectric layer; a second conductive feature over and electrically coupling to the first conductive feature, wherein the second conductive feature comprises a diffusion barrier; and a metallic material encircled by the diffusion barrier; a protection layer encircling and contacting the second conductive feature, wherein the protection layer contacts a top surface of at least one of the first dielectric layer and the first conductive feature; an air spacer encircling the protection layer; and a dielectric layer encircling the air spacer. In an embodiment, the protection layer comprises a dielectric material. In an embodiment, the second conductive feature is fully separated from the air spacer by the protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a dielectric layer to form an opening, wherein a first conductive feature underlying the dielectric layer is exposed to the opening;
    depositing a sacrificial spacer layer extending into the opening;
    performing a first etching process to etch the sacrificial spacer layer, wherein a first bottom portion of the sacrificial spacer layer at a bottom of the opening is removed to reveal the first conductive feature, and a first vertical portion of the sacrificial spacer layer in the opening and on a sidewall of the dielectric layer is left to form a sacrificial ring;
    depositing a protection layer extending into the opening and on the sacrificial ring;
    performing a second etching process to etch the protection layer, wherein a second bottom portion of the protection layer is removed to reveal the first conductive feature, and a second vertical portion of the protection layer in the opening is left to form a protection ring;
    forming a second conductive feature in the opening, wherein the second conductive feature is encircled by the sacrificial ring, and is over and electrically coupled to the first conductive feature; and
    removing the sacrificial ring to form an air spacer.

2. The method of claim 1, wherein the depositing the sacrificial spacer layer comprises a conformal deposition process.

3. The method of claim 1 further comprising forming a metal capping layer over the second conductive feature, wherein the metal capping layer comprises an extension portion extending into the air spacer.

4. The method of claim 1, wherein the first etching process and the second etching process comprise anisotropic etching processes.

5. The method of claim 1, wherein the depositing the sacrificial spacer layer comprises depositing a silicon layer.

6. The method of claim 1, wherein after the opening is formed, a top surface of an underlying feature is exposed, and wherein the protection ring comprises a bottom surface in physical contact with the top surface.

7. The method of claim 1, wherein the protection ring comprises a dielectric material.

8. The method of claim 1, wherein the protection ring comprises a conductive material.

9. The method of claim 1, wherein the forming the second conductive feature comprises:
    depositing a conductive barrier layer extending into the opening and contacting the protection ring; and
    depositing a conductive region on the conductive barrier layer.

10. The method of claim 1, wherein the second conductive feature is fully separated from the air spacer by the protection ring.

11. The method of claim 1, wherein the opening comprises a trench and a via opening underlying the trench, and the sacrificial ring is in the trench, and the first etching process further forms an additional sacrificial ring in the via opening.

12. The method of claim 11, wherein the protection ring comprises a sidewall facing the air spacer.

13. A method comprising:
forming a first etch stop layer over a first conductive feature;
forming a dielectric layer over the first etch stop layer;
forming a structure comprising:
a second conductive feature in the dielectric layer and the first etch stop layer, wherein the second conductive feature is over and electrically coupling to the first conductive feature;
a protection ring encircling the second conductive feature; and
a sacrificial ring encircling the protection ring;
removing the sacrificial ring to form an air spacer encircling the protection ring, wherein sidewalls of the dielectric layer are exposed to the air spacer.

14. The method of claim 13, wherein the first conductive feature is formed in an additional dielectric layer, and wherein the protection ring has a bottom surface in contact with at least one of the first conductive feature and the additional dielectric layer.

15. The method of claim 13 further comprising depositing a second etch stop layer over and contacting the dielectric layer and the second conductive feature, wherein a bottom surface of the second etch stop layer is exposed to the air spacer.

16. The method of claim 13, wherein the protection ring fully separates the second conductive feature from the air spacer, with no portion of the second conductive feature being exposed to any portion of the air spacer.

17. The method of claim 13, wherein the protection ring comprises a conductive material.

18. A method comprising:
forming a first dielectric layer;
forming a first conductive feature in the first dielectric layer;
forming a second conductive feature over and electrically coupling to the first conductive feature, wherein the second conductive feature comprises:
a diffusion barrier; and
a metallic material encircled by the diffusion barrier;
forming a protection ring encircling and contacting the second conductive feature, wherein the protection ring contacts a top surface of at least one of the first dielectric layer and the first conductive feature; and
forming an air spacer encircling the protection ring, wherein the air spacer separates the protection ring from a second dielectric layer that encircles the air spacer.

19. The method of claim 18, wherein the forming the air spacer comprises:
forming a sacrificial ring encircling the protection ring; and
removing the sacrificial ring.

20. The method of claim 18, wherein the second conductive feature is fully separated from the air spacer by the protection ring.

* * * * *